United States Patent
Nishikawa et al.

(10) Patent No.: US 11,487,454 B2
(45) Date of Patent: Nov. 1, 2022

(54) SYSTEMS AND METHODS FOR DEFINING MEMORY SUB-BLOCKS

(71) Applicant: SanDisk Technologies LLC, Addison, TX (US)

(72) Inventors: Masatoshi Nishikawa, San Jose, CA (US); Hardwell Chibvongodze, San Jose, CA (US)

(73) Assignee: SanDisk Technologies LLC, Addison, TX (US)

(*) Notice: Subject to any disclaimer, the term of this patent is extended or adjusted under 35 U.S.C. 154(b) by 294 days.

(21) Appl. No.: 16/704,729

(22) Filed: Dec. 5, 2019

(65) Prior Publication Data

US 2021/0173559 A1     Jun. 10, 2021

(51) Int. Cl.
| | |
|---|---|
| *G11C 16/24* | (2006.01) |
| *G06F 3/06* | (2006.01) |
| *G06F 13/16* | (2006.01) |
| *G11C 16/14* | (2006.01) |
| *G11C 16/04* | (2006.01) |

(52) U.S. Cl.
CPC .......... *G06F 3/064* (2013.01); *G06F 3/0604* (2013.01); *G06F 3/0632* (2013.01); *G06F 3/0679* (2013.01); *G06F 13/1668* (2013.01); *G11C 16/14* (2013.01); *G11C 16/24* (2013.01); *G11C 16/0483* (2013.01)

(58) Field of Classification Search
CPC ...... G06F 3/064; G06F 3/0604; G06F 3/0632; G06F 3/0679; G06F 13/1668; G11C 16/14; G11C 16/24; G11C 16/0483; G11C 16/08; G11C 16/16
USPC ...................................... 365/185.17, 185.24
See application file for complete search history.

(56) References Cited

U.S. PATENT DOCUMENTS

| | | | | |
|---|---|---|---|---|
| 6,407,961 | B1 * | 6/2002 | Perets | G11C 7/1075 365/230.02 |
| 7,889,538 | B2 * | 2/2011 | Toda | G11C 29/83 365/148 |
| 9,953,717 | B2 | 4/2018 | Sabde et al. | |
| 2003/0128581 | A1 * | 7/2003 | Scheuerlein | G11C 8/10 365/185.03 |
| 2003/0128617 | A1 * | 7/2003 | Choi | G11C 8/12 365/230.03 |
| 2006/0126419 | A1 * | 6/2006 | Hong | G11C 8/12 365/230.03 |
| 2012/0170365 | A1 | 7/2012 | Kang et al. | |

(Continued)

OTHER PUBLICATIONS

International Search Report and Written Opinion, PCT/US2020/024583, dated Aug. 26, 2020.

*Primary Examiner* — Michael T Tran
(74) *Attorney, Agent, or Firm* — Dickinson Wright PLLC; Steven C. Hurles

(57) ABSTRACT

A method for memory block management includes identifying a first group of bit lines corresponding to memory blocks of a 3-dimensional memory array. The method also includes biasing the first group of bit lines to a first voltage using respective bit line biasing transistors. The method also includes identifying, for each memory block, respective sub-memory blocks corresponding to word lines of each memory block that intersect the first group of bit lines. The method also includes logically grouping memory addresses of memory cells for each respective sub-memory block associated with the first group of bit lines.

19 Claims, 10 Drawing Sheets

(56) References Cited

U.S. PATENT DOCUMENTS

| | | |
|---|---|---|
| 2014/0307504 A1 | 10/2014 | Hung et al. |
| 2017/0069391 A1 | 3/2017 | Lee |
| 2017/0162252 A1* | 6/2017 | Ware .................... G11C 11/4094 |
| 2019/0043836 A1 | 2/2019 | Fastow et al. |
| 2019/0196744 A1* | 6/2019 | Kim ........................ G11C 16/14 |
| 2019/0378583 A1* | 12/2019 | Lien .................... G11C 16/0483 |
| 2019/0392909 A1* | 12/2019 | Yang .................. G11C 16/3459 |
| 2020/0004629 A1* | 1/2020 | Zamir .................... G06F 3/0619 |
| 2020/0211636 A1* | 7/2020 | Hiscock ............ G11C 11/40622 |
| 2022/0051739 A1* | 2/2022 | Hwang ............... G11C 11/5628 |
| 2022/0051741 A1* | 2/2022 | Choi ...................... G11C 29/04 |
| 2022/0066671 A1* | 3/2022 | Lee ..................... G11C 11/5642 |
| 2022/0084595 A1* | 3/2022 | Kusaka .................. G11C 16/26 |
| 2022/0091760 A1* | 3/2022 | Lee ........................ G06F 3/0679 |
| 2022/0093183 A1* | 3/2022 | Kim ...................... G11C 7/1048 |
| 2022/0100405 A1* | 3/2022 | Lee ........................ G06F 3/0659 |
| 2022/0113870 A1* | 4/2022 | Cho ........................ G06F 3/0616 |
| 2022/0114115 A1* | 4/2022 | Enamandram ...... G06F 13/1647 |
| 2022/0130473 A1* | 4/2022 | Choi .................. G11C 16/3404 |
| 2022/0137851 A1* | 5/2022 | Kim .......................... H04L 9/32 |
| | | 711/154 |
| 2022/0172780 A1* | 6/2022 | Choi ..................... G11C 16/32 |
| 2022/0200633 A1* | 6/2022 | Kim ..................... G11C 16/349 |

\* cited by examiner

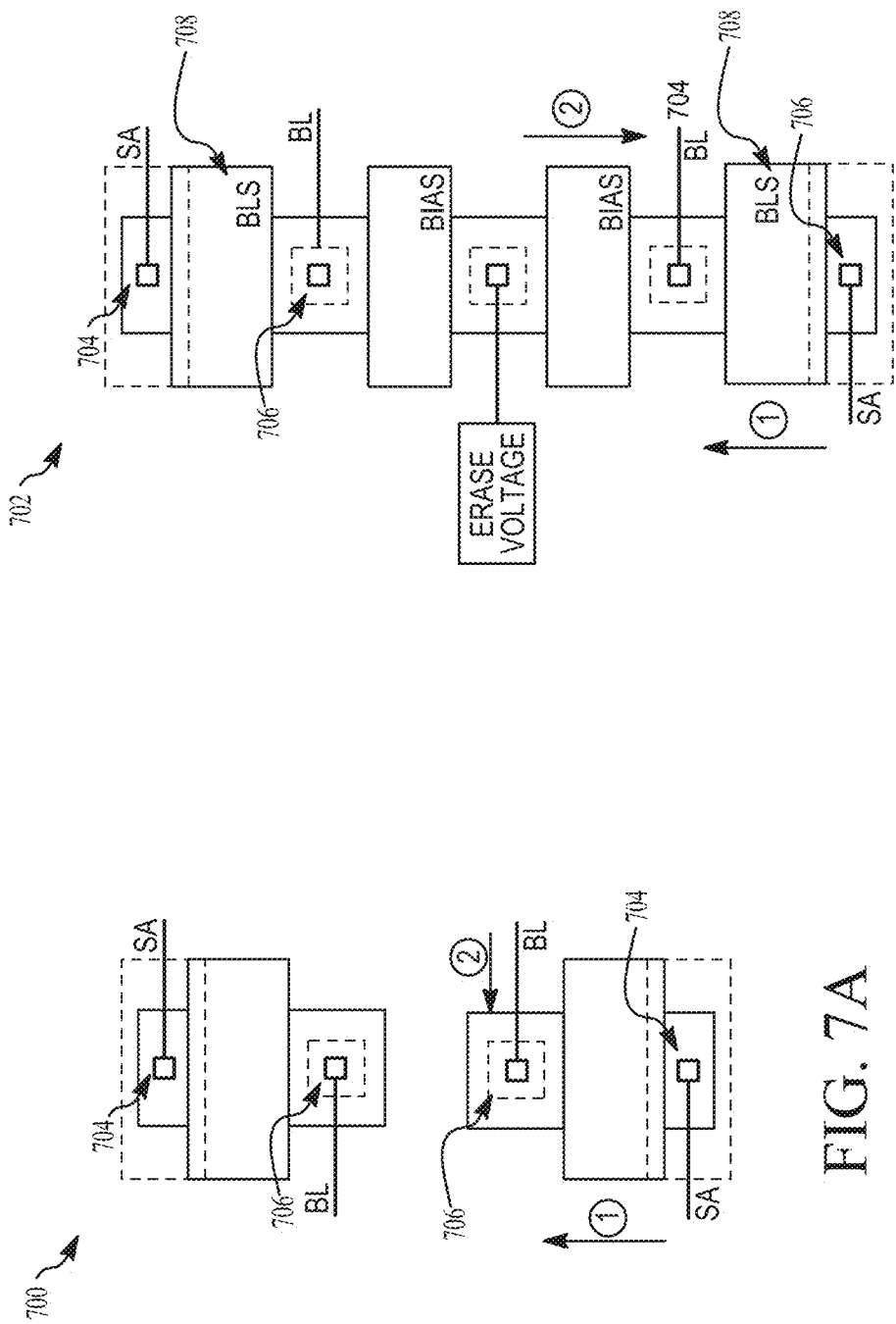

SYSTEMS AND METHODS FOR DEFINING MEMORY SUB-BLOCKS

TECHNICAL FIELD

This disclosure relates to memory systems and in particular to systems and methods for defining memory sub-blocks by grouping bit lines.

BACKGROUND

Non-volatile memory systems are a type of memory that retains stored information without requiring an external power source. Non-volatile memory is widely used in various electronic devices and in stand-alone memory devices. For example, non-volatile memory can be found in laptops, digital audio player, digital cameras, smart phones, video games, scientific instruments, industrial robots, medical electronics, solid-state drives, USB drives, memory cards, and the like. Non-volatile memory can be electronically programmed/reprogrammed and erased.

Examples of non-volatile memory systems include flash memory, such as NAND flash or NOR flash. NAND flash memory structures typically arrange multiple memory cell transistors (e.g., floating-gate transistors or charge trap transistors) in series with and between two select gates (e.g., a drain-side select gate and a source-side select gate). The memory cell transistors in series and the select gates may be referred to as a NAND string. NAND flash memory may be scaled in order to reduce cost per bit.

SUMMARY

This disclosure relates generally to memory management systems and methods.

An aspect of the disclosed embodiments is a method for memory block management. The method includes identifying a first group of bit lines corresponding to memory blocks of a 3-dimensional memory array. The method also includes biasing the first group of bit lines to a first voltage using respective bit line biasing transistors. The method also includes identifying, for each memory block, respective sub-memory blocks corresponding to word lines of each memory block that intersect the first group of bit lines. The method also includes logically grouping memory addresses of memory cells for each respective sub-memory block associated with the first group of bit lines.

Another aspect of the disclosed embodiments is a controller that includes a bus interface and a processor. The bus interface is in communication with a plurality of memory blocks of a 3-dimensional memory array. The processor is configured to: identify a first group of bit lines corresponding to the memory blocks; bias the first group of bit lines to a first voltage using respective bit line biasing transistors: identify, for each memory block, respective sub-memory blocks corresponding to word lines of each memory block that intersect the first group of bit lines; and logically group memory addresses of memory cells for each respective sub-memory block associated with the first group of bit lines.

Another aspect of the disclosed embodiments is a method for defining sub-memory blocks in a memory system. The method includes identifying a plurality of bit line groups corresponding to memory blocks of a 3-dimensional memory array. The method also includes biasing each bit line group of the plurality of bit line groups to a respective voltage using bit line biasing transistors corresponding to each respective bit line group of the plurality of bit line groups. The method also includes identifying, for each memory block, respective sub-memory blocks corresponding to word lines of each memory block that intersect with respective ones of the bit line groups of the plurality of bit line groups. The method also includes logically grouping memory addresses of memory cells for each respective sub-memory block.

These and other aspects of the present disclosure are disclosed in the following detailed description of the embodiments, the appended claims, and the accompanying figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

FIGS. 7A and 7B generally illustrate various memory devices according to the principles of the present disclosure.

DETAILED DESCRIPTION

Figure 1A:
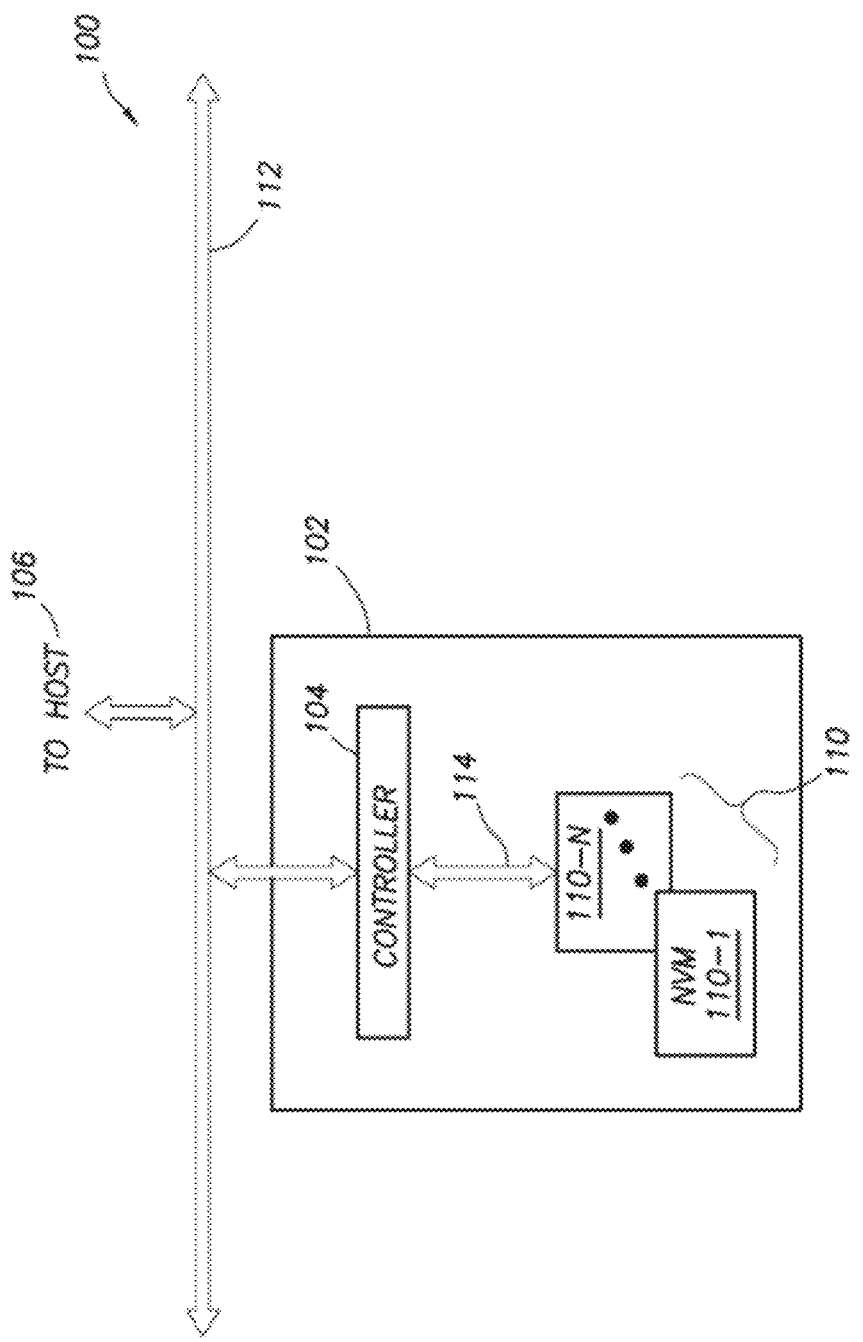
FIGS. 1A-1B generally illustrates a block diagram of an example non-volatile memory system according to the principles of the present disclosure.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

As described, non-volatile memory systems are a type of memory that retains stored information without requiring an external power source. Non-volatile memory is widely used in various electronic devices and in stand-alone memory devices. For example, non-volatile memory can be found in laptops, digital audio player, digital cameras, smart phones, video games, scientific instruments, industrial robots, medical electronics, solid-state drives, USB drives, memory cards, and the like. Non-volatile memory can be electronically programmed/reprogrammed and erased.

Examples of non-volatile memory systems include flash memory, such as NAND flash or NOR flash. NAND flash memory structures typically arrange multiple memory cell transistors (e.g., floating-gate transistors or charge trap transistors) in series with and between two select gates (e.g., a drain-side select gate and a source-side select gate). The memory cell transistors in series and the select gates may be referred to as a NAND string. NAND flash memory may be scaled in order to reduce cost per bit. However, as process geometries shrink, many design and process challenges are presented. These challenges include increased variability in transistor characteristics over process, voltage, and temperature.

In typical memory systems, a controller in communication with the memory blocks of the memory system, performs operations, such a read operations, program operations, erase operations, and the like. Such operations are performed by the controller at the memory block level. For example, the controller may perform an erase operation on an entire memory block before continuing to a subsequent memory block. Accordingly, performance of such operations by the controller on memory blocks of a 3-dimensional memory system (e.g., having larger memory block sizes) may be relatively inefficient. For example, garbage collection may be inconvenient, performance of program (e.g., write) operations may be amplified due to unnecessary cycle, and so on. Additionally, an erase inhibit on unselected memory blocks typically uses relatively high voltages. Such high voltages may result in higher current consumption (e.g., due to low efficiency during high voltage generation within the memory system).

Accordingly, systems and methods, such as those described herein, that define sub-memory blocks having smaller sizes than corresponding memory blocks of the memory system, may be desirable. In some embodiments, the systems and methods described herein may define sub-memory blocks along x-direction of a memory array using word lines having different error voltage signal controls. The systems and methods described herein may control the error voltage using biasing transistors corresponding to selected bit line groups of the memory array. The systems and methods described herein may divide memory block into multiple bit line groups. For example, a 16-kilobyte page may be divided into two 8 kilobyte bit line groups, four 4 kilobyte bit line groups, eight 2 kilobyte bit line groups, or sixteen 1 kilobyte bit line groups.

In some embodiments, the systems and methods described herein may be configured to use a pseudo random access mode to perform a partial page program with the commonly grouped bit lines. In some embodiments, the systems and methods described herein may be configured to perform an erase operation, such as a drain side gate induced drain leak (GIDL), erase operation on commonly grouped bit lines.

In some embodiments, the memory systems described herein may include a complementary metal-oxide semiconductor (CMOS) under the array memory structure (CUA). In some embodiments, the memory systems described herein may include a CMOS adjacent to the array memory structure (CAA). In some embodiments, the memory systems described herein may include a CMOS next to the array memory structure (CNA).

In some embodiments, the systems and methods described herein may be configured to identify a first group of bit lines corresponding to memory blocks of a 3-dimensional memory array. The systems and methods described herein may be configured to bias the first group of bit lines to a first voltage using respective bit line biasing transistors. The systems and methods described herein may be configured to identify, for each memory block, respective sub-memory blocks corresponding to word lines of each memory block that intersect the first group of bit lines. The systems and methods described herein may be configured to logically group memory addresses of memory cells for each respective sub-memory block associated with the first group of bit lines.

In some embodiments, systems and methods described herein may be configured to identify a plurality of bit line groups corresponding to memory blocks of a 3-dimensional memory array. The systems and methods described herein may be configured to bias each bit line group of the plurality of bit line groups to a respective voltage using bit line biasing transistors corresponding to each respective bit line group of the plurality of bit line groups. The systems and methods described herein may be configured to identify, for each memory block, respective sub-memory blocks corresponding to word lines of each memory block that intersect with respective ones of the bit line groups of the plurality of bit line groups. The systems and methods described herein may be configured to logically group memory addresses of memory cells for each respective sub-memory block.

In some embodiments, the systems and methods described herein may be configured to provide: faster garbage collection speeds (e.g., due to a smaller sub-memory block size); reduced amplification of performance of write operations; decreased current requirements during performance of a partial erase operation (e.g., due to a relatively limited area for performing the erase operation and less loading of a charge pump during the erase operation); and improved erase operation performance (e.g., because error voltage pre-charging may be less time consuming). Additionally, the systems and methods described herein be configured to define sub-memory blocks for corresponding memory block of a memory array at without additional memory hardware or memory hardware changes.

FIG. 1A illustrates a block diagram of an example system architecture 100 including non-volatile memory. In particular, the example system architecture 100 includes storage system 102 (e.g., which may be referred to as a memory system), a controller 104, and a host 106. In various embodiments, the host 106 can include any device or system that utilizes the storage system 102. In some embodiments, various aspects of the controller 104 may be implemented by the host 106 or the host 106 can include its own controller (e.g., a processor) configured to execute instructions stored in the storage system 102 and further the host 106 can access data stored in the storage system 102.

Examples of the host 106 include computing devices such as a desktop computer, rack mounted server, a laptop, a smartphone, a tablet, or other suitable computing devices. Host 106 can also include systems and devices such as a gaming system, a digital phone, a digital camera (e.g., digital still cameras and digital movie cameras), portable media player, digital photo frame, remote control, television stick, smart television, and the like. Furthermore, the system architecture 100 can be implemented in a memory card such as secure digital (SD) card or a micro secure digital (micro-SD) card. In some embodiments, the system architecture 100 is embedded in the host, for example as a solid-state disk (SSD) drive installed in a laptop computer.

In embodiments where the system architecture 100 is implemented within a memory card, the host 106 can include a built-in receptacle for one or more types of memory cards or flash drives (e.g., a universal serial bus (USB) port, or a memory card slot). Additionally, or alternatively, the host 106 can include adapters into which a memory card may be plugged. The foregoing examples of a host are not meant to be limiting examples. On the contrary, a host 106 can include any type of device, system, and apparatus that accesses the storage system 102.

In FIG. 1A, the storage system 102 includes a memory controller and drivers (e.g., controller 104)—as will be described further below—however, in some embodiments of the storage system 102, the storage system 102 may include memory-only units that are instead controlled by software executed by a controller on the host 106 (e.g., a processor of a computing device controls, including error handling of, the storage system 102). Furthermore, although FIG. 1A illustrates the storage system 102 as separate from the host 106, in some embodiments, the storage system 102 is embedded with the host 106, where the memory, controller, and drivers are formed on a single integrated circuit chip.

The host 106 can communicate with the storage system 102 using of a bus 112 that implements any known or after developed communication protocol that enables the storage system 102 and the host 106 to communicate. The communication protocol may include Secure Digital (SD) protocol, Memory stick (MS) protocol, USB protocol, Advanced Microcontroller Bus Architecture (AMBA), or other suitable communication protocol.

In various embodiments, the controller 104 acts as an interface between the host 106 and the storage system 102. The host 106 may communicate with the controller 104 via a bus interface associated with the bus 112. The controller 104 can include individual circuit components, processing circuitry (e.g., logic gates and switches), a processor, a microprocessor, a microcontroller with controlling software, or a field programmable gate array (FPGA). Furthermore, the example controller 104 includes a computer-readable medium that stores computer-readable program code (e.g., software or firmware) executable by the processor. In some embodiments, the controller 104 is a flash memory controller. In some embodiments, the controller 104 is a processor executing within the host 106.

Still referring to FIG. 1A, according to some embodiments, the controller 104 acts as an interface between the host 106 and the storage system 102 and manages data stored on the storage system 102. For example, the host 106 can access data stored in the storage system 102 by providing a logical address, via the bus interface associated with the bus 112, to the controller 104, which, the controller 104 converts to a physical address. The controller 104 can access data and/or a particular storage location associated with the physical address and facilitate transferring data between the storage system 102 and the host 106. In some embodiments, where the storage system 102 includes flash memory, the controller 104 formats the flash memory to ensure the memory is operating properly, maps out bad flash memory cells, and allocates spare cells to be substituted for future failed cells or used to hold firmware to operate the flash memory controller (e.g., the controller 104).

Accordingly, the controller 104 performs various memory management functions such as wear leveling (e.g., distributing writes to extend the lifetime of the memory blocks), garbage collection (e.g., moving valid pages of data to a new block and erasing the previously used block), and error detection and correction (e.g., read error handling).

Still referring to FIG. 1A, the storage system 102 includes the non-volatile memory (NVM) block 110 which may include several memory die 110-1-110-N. In some embodiments, the NVM block 110 defines a physical set of memory die, such as the memory die 110-1-110-N. In other embodiments, the NVM block 110 defines a logical set of memory die, where the NVM block 110 includes memory die from several physically different sets of memory die. The manner in which the NVM block 110 is defined in FIG. 1A is not meant to be limiting.

Each memory die, for example memory die 110-1, includes non-volatile memory cells, such as NAND flash memory cells, NOR flash memory cells, or other suitable memory cells. As the memory cells are non-volatile, the memory cells in the storage system 102 retain data even when there is an interruption in power supplied to the memory cells and/or the storage system 102. Thus, the storage system 102 can be easily transported and the storage system 102 can be used in memory cards and other memory devices that are not always connected to a power supply.

In various embodiments, the memory cells in the memory die 110 are solid-state memory cells (e.g., flash) and are one-time programmable, few-time programmable, or many time programmable. Additionally, the memory cells in the memory die 110 can include single-level cells (SLC), multi-tiple-level cells (MLC), or triple-level cells (TLC). In some embodiments, the memory cells are fabricated in a planar manner (e.g., 2D NAND (NOT-AND) flash) or in a stacked or layered manner (e.g., 3D NAND flash). That is, planar flash memory includes a single layer of memory cell, while stacked flash memory includes memory cells that are stacked vertically in multiple layers (e.g., referred to as planes).

In some embodiments, and as shown in FIG. 1A, the controller 104 and the NVM block 110 are communicatively coupled by an interface 114 that implements any known or after developed communication protocol. In embodiments where the storage system 102 is flash memory, the interface 114 is a flash interface, such as Toggle Mode 200, 400, 800, or Common Flash Memory Interface (CFI). In various embodiments, the interface 114 can be implemented by several channels (i.e., physical connections) disposed between the controller 104 and the individual memory die 110-1-110-N. Furthermore, the number of channels over which the interface 114 is established varies based on the capabilities of the controller 104. Additionally, a single channel can be configured to communicatively couple more than one memory die. The depiction of a single interface 114 is not meant to be limiting. To the contrary, the single interface is representative of an example interface that can be used between components, and one or more interfaces can be used to communicatively couple the same components.

Figure 1B:
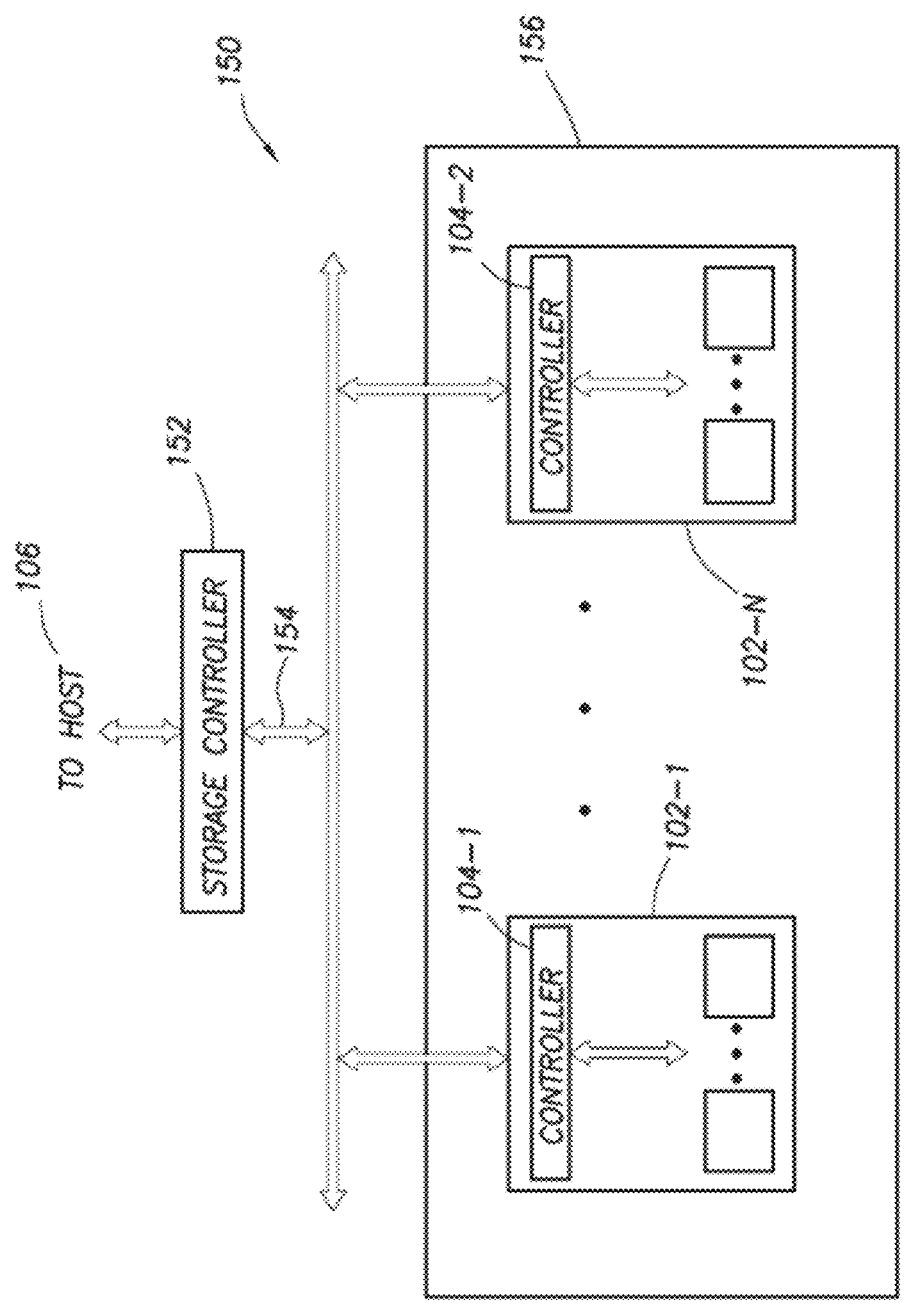

FIG. 1B generally illustrates a block diagram of a system architecture 100 according to the principles of the present disclosure. The system architecture 100 can be implemented as part of a larger system architecture. For example, as shown in FIG. 1B, the system architecture 150 includes a storage module 156 that further includes several storage systems 102. Within the example system architecture 150, the storage module 156 is communicatively coupled with the host 106 by way of a storage controller 152. In particular, an interface 154 between the host 106 and the storage module 156 includes a bus interface that implements any known or after developed communication protocol, such as a serial advanced technology attachment (SATA) or peripheral component interface express (PCIe) interface. In some embodiments, the storage module 156 is an SSD (e.g., in a laptop computer or a tablet).

Some implementations of the system architecture 100 include a hierarchical storage system. A hierarchical storage system can include a plurality of storage controllers 152, each of which control a respective storage system 102. Furthermore, a plurality of hosts 106 can each access the hierarchical storage system. Hosts 106 can access memories within the hierarchical storage system via a bus interface that implements any known or after developed communication protocol including a non-volatile memory express (NVMe) or a fiber channel over Ethernet (FCoE) interface. The hierarchical storage system can be implemented as a rack mounted storage system that is accessible by multiple host computers (e.g., a data center).

The interface 154 can be implemented by several channels (i.e., physical connections) disposed between the storage controller 152 and the storage module 156. In some embodiments, the number of channels over which an interface 154 is established varies based on the capabilities of the storage controller 152. The depiction of a single interface is not meant to be limiting and the single interface is representative of an example interface that can be used between components, where one or more interfaces can be used to communicatively couple various components.

Figure 2A:
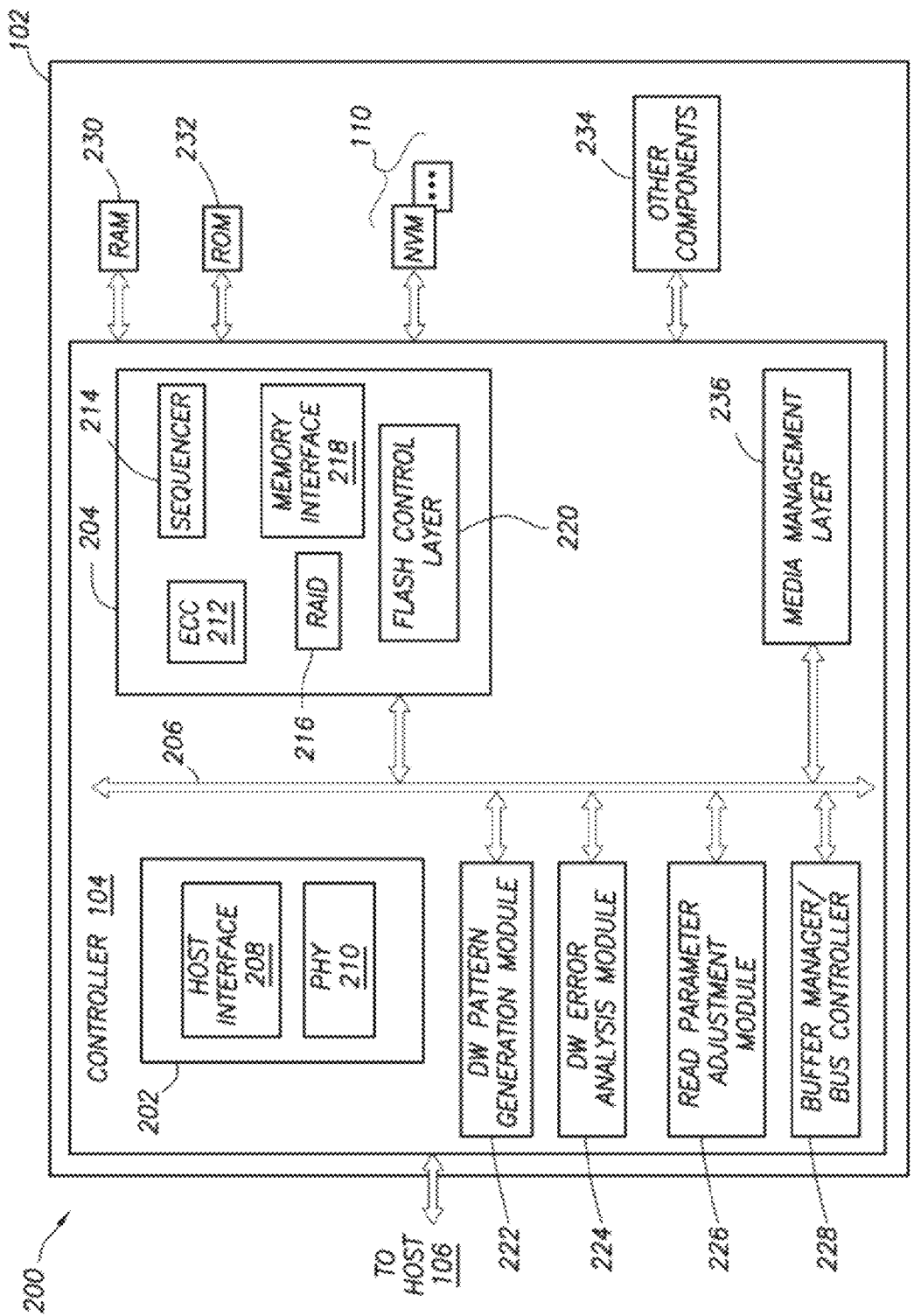
FIG. 2A generally illustrates a block diagram of example components of a controller according to the principles of the present disclosure.

FIG. 2A generally illustrates a block diagram 200 of the storage system 102, according to the principles of the present disclosure. The block diagram 200 of the storage system 102 includes components previously described in FIG. 1A, such as the controller 104 and the NVM memory block 110. Additional components that can be present within the storage system 102 include a random access memory (RAM) 230, a read only memory (ROM) 232, and other components 234. In some embodiments, the ROM 232 stores system boot code.

Although the RAM 230 and the ROM 232 are shown as separate modules within the storage system 102, the illustrated architecture is not meant to be limiting. For example, the RAM 230 and the ROM 232 can be located within the controller 104. In some embodiments, portions of the RAM 230 or ROM 232, respectively, are located outside the controller 104 and within the controller 104. In other embodiments, the controller 104, the RAM 230, and the ROM 232 can be located on separate semiconductor die. In various embodiments, the other components 234 include external electrical interfaces, external RAM, resistors, capacitors, logic gates, or other components that interface with the controller 104.

In some embodiments, the controller 104 includes a module 202 that interfaces with the host 106, a module 204 that interfaces with the NVM memory block 110, as well as various other modules, described further below. The modules within the controller (e.g., modules 202 and 204) are communicatively coupled to each other by a bus 206.

The following discussion of the various modules depicted within the controller 104 are meant to be illustrative and not limiting. For example, the various modules generally illustrated in FIG. 2A are not limited to being executed within the controller 104, and in some embodiments, one or more modules can be executed outside the controller 104.

The module 202 interfaces with the host 106 and includes a host interface 208 and a physical layer interface 210 that provides the electrical interface between the host 106 or next level storage controller and the controller 104. The host interface 208 facilitates transferring of data, control signals, and timing signals. Examples of the host interface 208 include SATA, SATA express, Serial Attached SCSI (SAS), Fibre Channel, USB, PCIe, and NVMe.

Still referring to FIG. 2A, in various embodiments, the module 204 is configured to communicate with the NVM block 110 and includes an error correcting code (ECC) engine 212. In some embodiments, the ECC engine 212 encodes data received from the host 106 and stores the encoded data in the NVM block 110. When the data is read out from the NVM memory block 110, the ECC engine 212 decodes the data and corrects errors detected within the data To detect errors, the ECC engine 212 implements various types of error checking using algorithms such as low-density parity-check (LDPC) code, Bose-Chaudhuri-Hocquenghem (BCH) code, a soft read, and/or extra parity.

The example module 204 also includes a sequencer 214 and a Redundant Array of Independent Drives (RAID) module 216. In various embodiments, the sequencer 214 generates command sequences, such as program and erase command sequences that are transmitted to the NVM memory block 110. The RAID module 216 generates RAID parity and recovery of failed data. The RAID parity can be used to provide an additional level of integrity protection for data written into the NVM memory block 110. In some embodiments, the ECC engine 212 implements the functions of the RAID module 216.

The example module 204 also includes a memory interface 218 that provides the command sequences to the NVM memory block 110 and receives status information from the NVM memory block 110. For example, the memory interface 218 implements any known or after developed communication protocol including a double data rate (DDR) interface, such as a Toggle Mode 200, 400, or 800 interface. The module 204 also includes a flash control layer 220 that controls the overall operation of the module 204.

Still referring to example modules within the controller 104 in FIG. 2A, additional modules within the controller 104 includes a dummy word line (DW) pattern generation module 222, a DW error analysis module 224, and a read parameter adjustment module 226. Dummy word lines are placed on non-volatile memory die that are used for the purposes of analyzing and tracking behavior and health of a respective non-volatile memory die. In various embodiments, the DW pattern generation module 222 puts a known data pattern into a dummy word line and tracks or periodically check for errors by reading the data back out of the dummy word line and comparing the data to the known data pattern.

In various embodiments, the read parameter adjustment module 226 adjusts parameters associated with a particular non-volatile memory die. For example—and as discussed further below—the read parameters adjustment module 226 can adjust parameters associated with a particular non-volatile memory die during an operation—i.e., a read or write—to adjust or re-adjust the read parameters. During the operation to re-adjust the read parameters, the read parameter adjustment module 226 adjusts the read parameters for a particular memory block, reads data out of the memory block, and verifies a resulting BER. If the resulting BER falls at or below a target or expected BER, the read parameters adjustment module 226 stores the read parameters for the memory block. Subsequently, the stored read parameters are used during a read of any word line within the memory block. Thus, read parameters can be unique to a memory block.

Additional modules within the example controller 104 include a buffer manager/bus controller 228 that manages, for example, buffers in the RANI 230 and controls the internal bus arbitration of the bus 206 in the controller 104. Additionally, or alternatively, the controller 104 can include a media management layer 236 that performs wear leveling of the NVM memory block 110. As previously mentioned, the various modules described with respect to the controller 104 are not meant to be limiting as to the architecture of the controller 104. For example, the physical layer interface 210, the RAID module 216, the media management layer 236, and the buffer management/bus controller 228 can be examples of optional components within the controller 104.

Furthermore, in embodiments where the storage system 102 includes flash memory, the media management layer 236 can be integrated as part of the flash management that handles flash error and interfaces with the host 106. In particular, the media management layer 236 can include an algorithm (e.g., firmware in the memory device), that translates a write command received from the host 106 into a write to the NVM memory block 110.

Figure 2B:
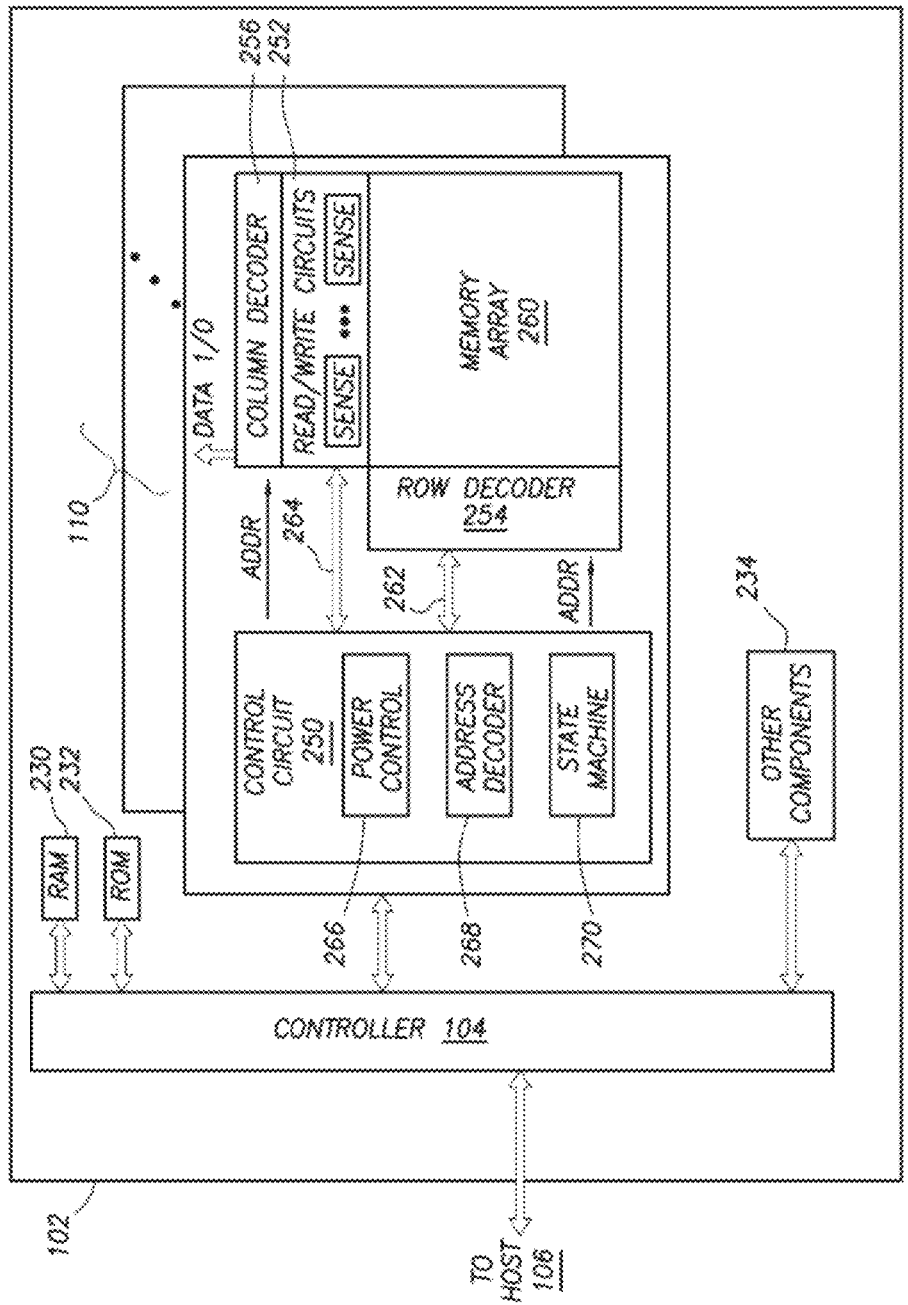
FIG. 2B generally illustrates a block diagram of example components of a non-volatile memory storage system according to the principles of the present disclosure.

FIG. 2B generally illustrates a block diagram with various features of the NVM memory block 110 within the storage system 102. As details of the controller 104 have been previously described (in FIG. 2A), in FIG. 2B the controller 104 is illustrated as a single block. Additionally, previously described RAM 230, the ROM 232, and the other components 234 are included in FIG. 2B to help orient the reader. Next, details within an example memory die 110-1 are discussed. Although the discussion centers on the memory die 110-1, each of the features discussed in relation to the memory die 110-1 equally applies to all of the memory dies within NVM memory block 110.

In some embodiments, the example memory die 110-1 includes control circuit 250, read/write circuits 252, a row decoder 254, a column decoder 256, and a memory array 260. The memory array 260 can include a two-dimensional array or a three-dimensional array of memory cells. The read/write circuits 252 read and program pages of memory within the memory die 110-1, in parallel. In various embodiments, the memory array 260 is accessed by word lines via the row decoder 254 and by bit lines via the column decoder 256.

The architecture of the memory die 110-1 is not meant to be limiting and any known architecture that can perform the functions of accessing the memory array 260 can be used without departing from the scope of this disclosure. For example, in various embodiments, access to the memory array 260 by various peripheral circuits can be implemented in a symmetric fashion on opposite sides of the memory array 260, which reduces the densities of access lines, and circuitry on each side of the memory array 260.

Still referring to FIG. 2B, in various embodiments, the example control circuit 250 includes a power control circuit 266, an address decoder 268, and a state machine 270. In some embodiments, the power control circuit 266, the address decoder 268, and the state machine 270 can be collectively referred to as managing circuits. The control circuit 250 and its various managing circuits are communicatively coupled by various interfaces (e.g., interfaces 262 and 264) to the row decoder 254 and the column decoder 256. In various embodiments, the control circuit 250 performs various operations on the memory array 260 that include reading or writing to the memory cells.

The power control circuit 266 controls the power and voltage supplied to the word lines and bit lines during operation of the memory array 260. The address decoder 268 provides an address interface that translates addresses between addresses provided by the host 106 and addresses used by the row decoder 254 and the column decoder 256. The example address decoder 268 converts an address provided by the host 106 to an address that is understood and compatible with a format used by the row decoder 254 and the column decoder 256. The state machine 270 provides chip-level control of memory operations.

Thus, the storage system 102 includes various components including the controller 104 and the NVM memory block 110, details of which have been described above in FIGS. 1A, 1B, 2A, and 2B. The discussion now turns to an example architecture of an example memory array 260 and in particular methods that can be performed to improve a performance of a read in the storage system 102.

Figure 3:
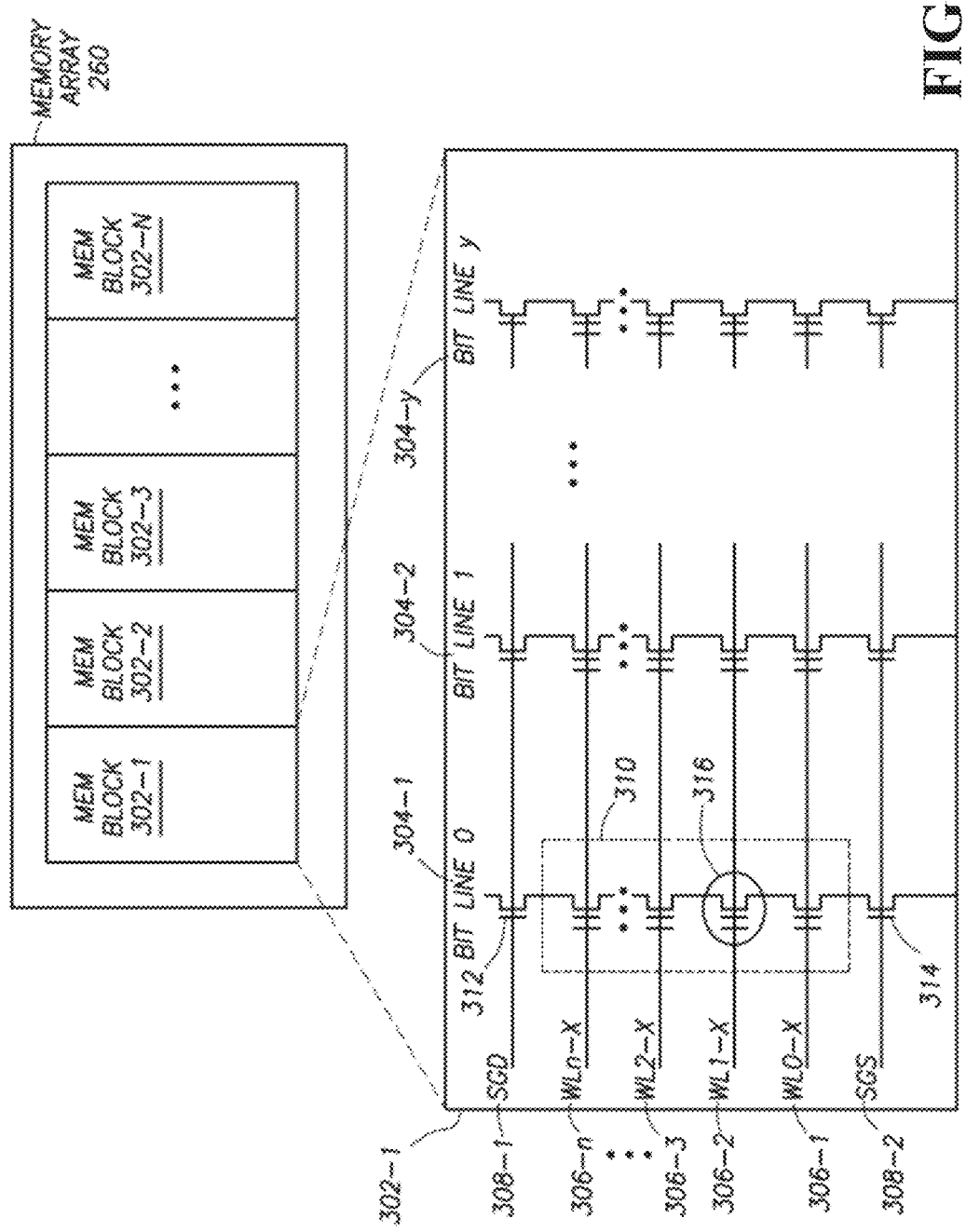
FIG. 3 generally illustrates a memory block according to the principles of the present disclosure.

FIG. 3 further illustrates the memory array 260. The memory array 260 is divided into several memory blocks 302. In flash memory, a memory block is defined as a unit of erase. That is, each memory block 302 includes a number of memory cells that are erased together or as a block. In some embodiments, the memory array 260 can be partitioned into any number of blocks, for example, the memory array 260 includes 1,024 blocks. Additionally, or alternatively, each of the memory blocks 302 can conceptually be divided into a number of pages defined as a unit of programming. In some embodiments, a page of data can be stored in one row of memory cells. Each page can include user data and overhead data, where the overhead data includes CC that has been calculated from the user data. In some embodiments, the memory blocks 302-1 to 302-N may include solid-state NAND memory blocks.

Each memory block 302, for example memory block 302-1, includes multiple bit lines 304, word lines 306, and select lines 308. Each bit line, for example bit line 304-1, is connected to several memory cells connected in series. More particularly, in an embodiment where each memory cell is a floating gate transistor, the floating gate transistors are connected in series to form a NAND string 310 (e.g., illustrated within the dashed box). Although four memory cells are shown in FIG. 3, the number of memory cells within the NAND string is not meant to be limiting. For example, 16, 32, 64, 128, or any other number of memory cells can be connected in a NAND string. Each respective bit line 304 is coupled to a respective NAND string within the block 302.

Still referring to FIG. 3, a method of reading data stored in a particular memory cell—e.g., memory cell 316—includes applying a voltage to the select lines 308 of the block 302, which in turn are coupled to respective NAND strings within the block 302, including the NAND string 310 the includes the memory cell 316. The voltage applied to the select lines 308 is greater than threshold voltages of the select transistors 312 and 314. The select transistor 312 is controlled by the select gate drain line (SGD) 308-1 and the select transistor 314 is controlled by the select gate source line (SGS) 308-2. Additionally, in order to read data in the memory cell 316, all other memory cells or unselected memory cells in the NAND string 319 are turned on (e.g., conducting current regardless of whether they are programmed or erased). The unselected memory cells have a read pass voltage—i.e., read parameters—applied to their respective word lines that turn on the unselected memory cells.

During the example read operation, various read compare levels—i.e., voltages—are applied to the word line 306-2 to determine the value stored in the memory cell 316. In some embodiments, the conduction current of the memory cell 316 is measured to determine the value stored within the memory cell 316. The method in which each memory cell is accessed and the number of memory cells accessed during a read or write varies. For example, all of the bit lines of the memory block 302-1 can be simultaneously programmed or read. In various embodiments, memory cells along a shared word line can be programmed at the same time (i.e., concurrently). In other embodiments, the bit lines can be divided into even bit lines and odd bit lines. In an odd/even bit line architecture, memory cells along a shared word line and connected to the odd bit lines are programmed at one time, while memory cells along a shared word line and connected to an even bit line are programmed at a different time.

Each time data is written to a memory block the data is processed by the ECC engine 212 which includes encoding the data (e.g., using a particular error correction code) and storing the encoded data in the memory block. When the data is read back out of the memory block, the data is processed by the ECC engine 212 which includes decoding the data, correcting errors (e.g., tracked as the BER), and returning the data to a user (by way of the controller 104). In some embodiments, the amount of time the ECC engine 212 takes to return data to the controller 104 is defined as the throughput time.

In some embodiments, the controller 104 performs data consolidation operations on the memory array 260. The controller 104 selects a source block from the memory block 302-1 to memory block 302-N of the memory array 260, for consolidation or compaction. For example, the controller 104 may select memory block 302-1 as the source block for consolidation or compaction. The memory block 302-1 may be referred to as the source block 302-1 throughout the example embodiments described herein. The source block 302-1 may include a plurality of memory fragments, such as 16 memory fragments or any suitable number of memory fragments. The memory fragments may include data written by the host 106 during a host write operation. The memory fragments may belong to respective logical groups and may be scattered or disorganized in the source block 302-1, such that memory fragments associated with the same logical group may not be sequentially stored or organized in the source block 302-1. Additionally, or alternatively, while some memory fragments include data written by the host 106 during a host write operation, other memory fragments scattered throughout the source block 302-1 may be blank (e.g., having been erased by the host 106 or the controller 104 or having not been written to by the host 106).

In some embodiments, the storage system 102 may include one or more charge pumps that generate voltages used by the controller 104 to perform operations, such as erase operations, programming operations, write operations, read operations, and the like on one or more memory cells of the memory blocks 302-1 to 302-N. The charge pump may increase or decrease a supply voltage and provide voltage pulses (e.g., using the increased or decreased voltage) to the memory cells. For example, the charge pump may double the voltage from the supply voltage, triple the voltage from the supply voltage, half the voltage from the supply voltage, or increase or decrease the voltage from the supply voltage to any suitable factor of the supply voltage in order to generate voltage pulses at a voltage required for performing operations the memory cells.

In some embodiments, the charge pump is connected to one or more capacitors. For example, the charge pump may be connected to the one or more capacitors in parallel or series. In some embodiments, the charge pump may be connected to some capacitors in parallel and some capacitors in series. During a first pulse of the charge pump operation, the charge pump, using the supply voltage, may charge the one or more capacitors (e.g., bringing the capacitor to the same voltage as the supply voltage). The charge pump may include or be connected to a suitable switching device.

The charge pump may use the switching device to reconfigure the connection between the charge pump and the one or more capacitors, which may change the way the one or more capacitors are connected to the charge pump (e.g., from series to parallel, parallel to series, or a combination thereof). During a second pulse of the charge pump, the charge pump may supply voltage from the voltage supply to the one or more capacitors (e.g., being charged to the voltage of the voltage supply) which may double the voltage at the one or more capacitors. It should be understood that the charge pump may be connected to any number of capacitors in any suitable fashion and may use the supply voltage and the switching device to charge the capacitors to any suitable voltage. Additionally, or alternatively, the charge pump may use any number of pulses to charge the capacitors. The controller 104 may use the voltage stored in the capacitors by the charge pump to program the memory cells.

In some embodiments, the storage system 102 may include a complementary metal-oxide semiconductor (CMOS) adjacent to the array memory structure (CAA). In some embodiments, the storage system 102 may include a CMOS next to the array memory structure (CNA). In some embodiments, the storage system 102 may include a CMOS under the array memory structure (CUA). The CUA memory structure may include a cell source line that is formed above the CMOS transistor. Such a structure may reduce resistance by using a polymer or metal substrate, instead of a silicon substrate.

Figures 6A, 6B:
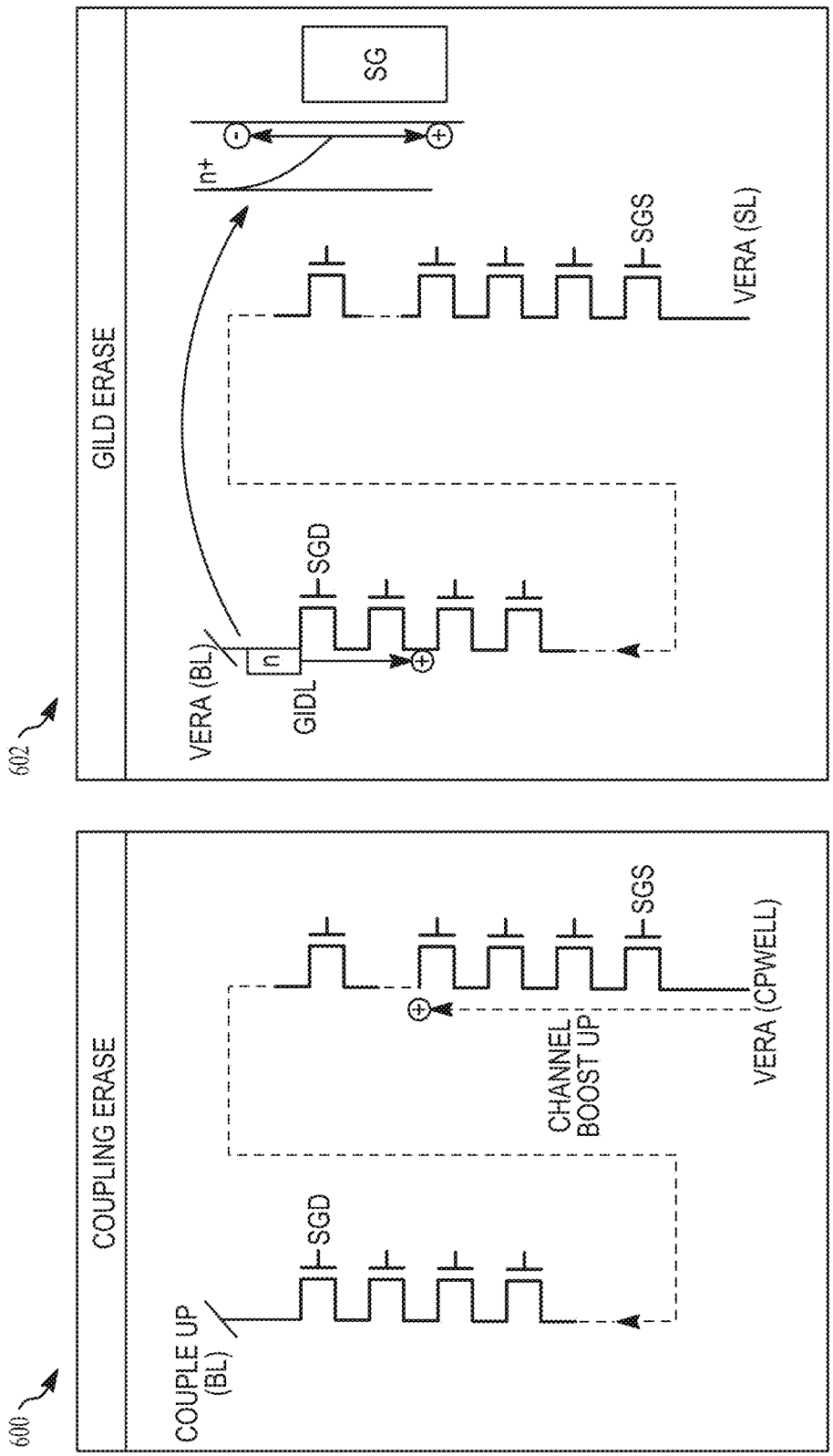
FIGS. 6A and 6B generally illustrate various memory erase operations for various memory devices according to the principles of the present disclosure.
Figure 8:
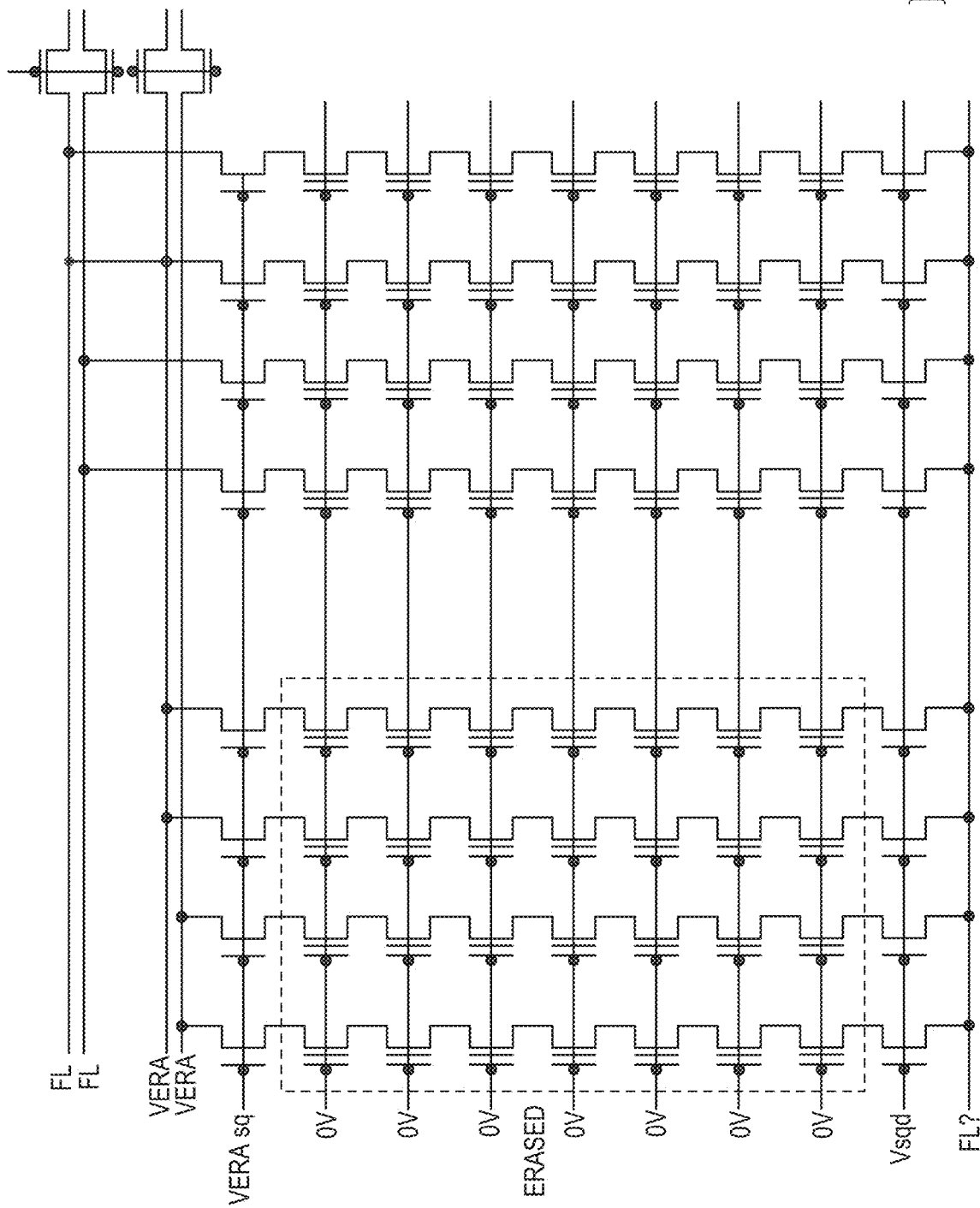
FIG. 8 generally illustrates an erase operation on a memory device according to the principles of the present disclosure.

FIG. 6A generally illustrates performance of a coupling erase operation on a memory cell 600 having a CNA memory structure. Performance of the coupling erase operation on the memory cell 600 may include injecting the error voltage from a cell P-well through an opening (e.g. a hole). In the memory cell 600, during performance of the coupling erase operation, the bit line voltage becomes the error voltage by coupling.

However, in order to perform a similar erase operation on a memory cell having a CUA memory structure, such as the memory cell 602 generally illustrated in the FIG. 6B, the erase operation may change from a conventional coupling erase operation to a GIDL erase operation. such as Performing memory operations, such as erase operations For example, performance of the GIDL erase operation may require an alternative bit line hookup (BLHU) (e.g., because the error voltage is applied from the bit line). As is illustrated in FIG. 6B, an opening is generated the GIDL erase operation in a source gate drain (SGD) region. The error voltage is applied from bit line, which, according, receives the error voltage for another circuit.

FIG. 7A generally illustrates a conventional bit line hookup transistor 700 (BLHU Tr). The BLHU Tr 700 may require voltage transfer from sense amplifiers 704 to bit lines 706 during performance of a program operation and/or a read operation (e.g., gate-on) and may keep cut-off when the bit lines 706 is at an erase level (e.g., during performance of an erase operation, gate-off).

In some embodiments, the storage system 102 may be configured to perform a GIDL erase operation, as described. The include memory cells of the storage system 102 may include a bit line biasing transistor (BLBIAS Tr), such as the BLBIAS Tr 702, as is generally illustrated in FIG. 7A. For example, the memory cells of the storage system 102 may include the BLBIAS Tr 702 to enable performance of the GIDL erase operation in memory cells having a CUA memory structure. In some embodiments, the BLBIAS Tr 702 may supply the error voltage as a transfer gate for each of the bit lines 706 of the memory cells. For example, the BLBIAS Tr 702 may require voltage transfer from the sense amplifiers 704 to the bit lines 706 during performance of a program operation and/or a read operation (e.g., gate-on at a bit line select 708) and voltage transfer during performance of an erase operation (e.g., gate-on at BIAS 710).

Figure 4:
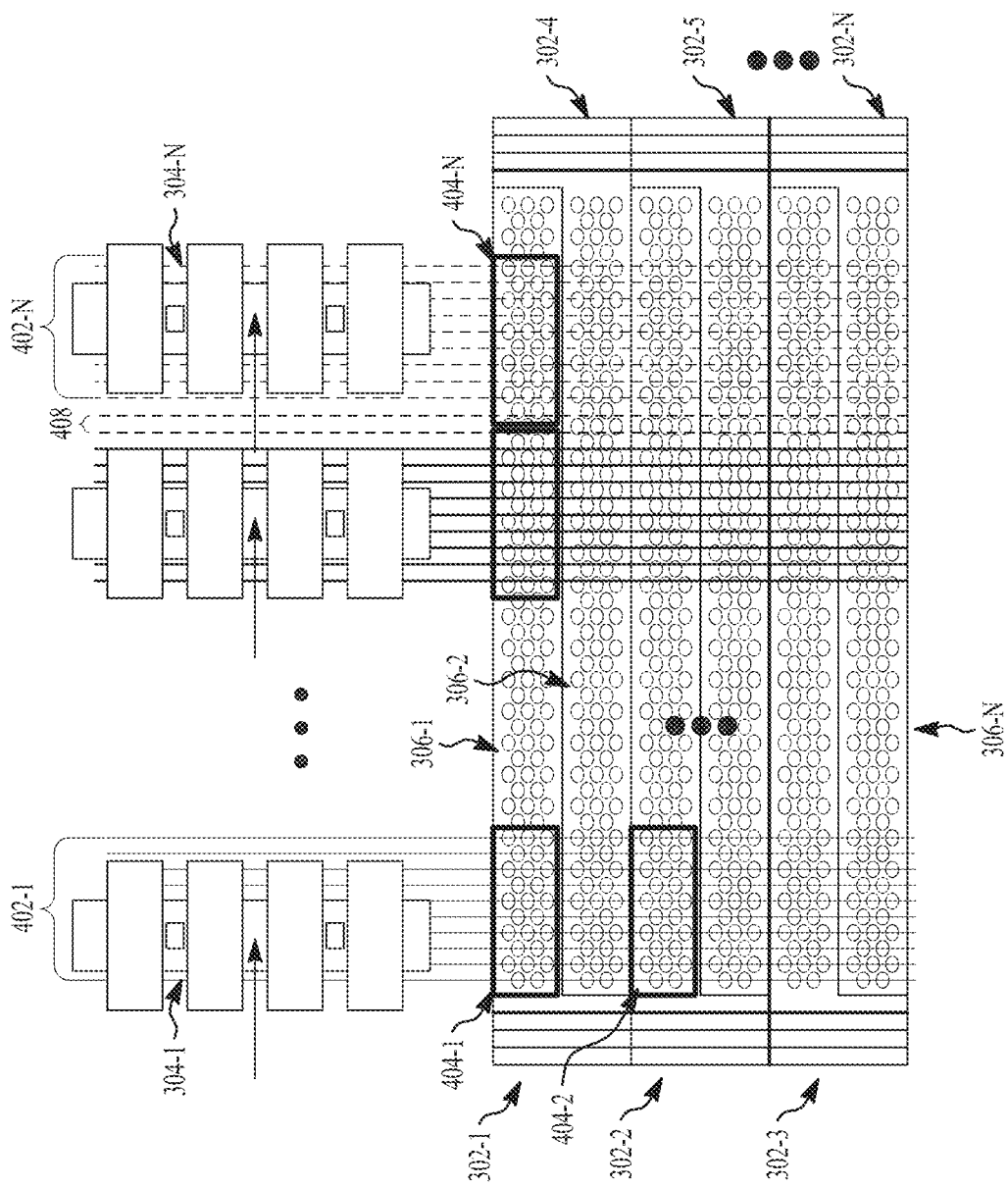
FIG. 4 generally illustrates a memory array according to the principles of the present disclosure.

As described, the controller 104 may be configured to define sub-memory blocks having smaller sizes than corresponding memory blocks 302-1 to 302-N of the storage system 102. As is generally illustrated in FIG. 4, as described, the storage system 102 may include a 3-dimensional structure that includes the plurality of memory blocks 302-1 to 302-N stacked or layered horizontally. The plurality of memory blocks 302-1 to 302-N may be connected by corresponding bit lines 304 (e.g. 304-1 to 304-N). For each, bit line 304 may be connected to each of the plurality of memory blocks 302-1 to 302-N. Each of the plurality of memory blocks 302-1 to 302-N includes or is connected to corresponding word lines 306-1 to 306-N. For example, the memory block 302-1 may be connected to word line 306-1; the memory block 302-2 may be connected to word line 306-2, and so on.

In some embodiments, controller 104 may be configured to define the sub-memory blocks, such as sub-memory blocks 404-1 to 404-N+1. The controller 104 may identify a plurality of groups of bit lines 402-1 to 402-N. Each of the plurality of groups of bit lines 402-1 to 402-N may include any suitable number of bit lines. For example, each of the plurality of groups of bit lines 402-1 to 402-N may include 8 kilobyte bit line groups, 4 kilobyte bit line groups, 2 kilobyte bit line groups, or 1 kilobyte bit line groups, or any suitable number of bit lines for each group of bit lines 402-1 to 402-N. Additionally, or alternatively, the controller 104 may identify any suitable number of groups of bit lines 402-1 to 402-N/ For example, 2 groups of bit lines, 4 groups of bit lines, 8, groups of bit lines, 16 groups of bit lines, or any suitable number of groups of bit lines.

As described, the controller 104 may identify a first group of bit lines 402-1. The controller 104 may selectively control bit line transistors corresponding to each of the bit lines of the first group of bit lines 402-1 to bias the bit lines of the first group of bit lines 402-1. For example, the controller 104 may selectively control the bit line transistors to bias the bit lines of the first group of bit lines 402-1 to a first voltage. The first voltage may include any suitable voltage. For example, the first voltage may be less than or equal to an erase voltage. The erase voltage may include a voltage used by the controller 104 during performance of an erase operation on the memory blocks 302-1 to 302-N.

The controller 104 may be configured to selectively control other bit line transistors corresponding to other groups of bit lines of the plurality of groups of bit lines 402-1 to 402-N to bias the bit lines corresponding to the other groups of bit lines of the plurality of groups of bit lines 402-1 to 402-N other respective voltages. For example, the controller 104 may selectively control bit line transistors corresponding to each of the bit lines of the group of bit lines 402-N to bias the bit lines of the group of bit lines 402-N to a second voltage. The second voltage may be different from the first voltage and may be equal to or less than the error voltage.

In some embodiments, the controller 104 is configured to identify sub-memory blocks that correspond to word lines 306-1 to 306-N that intersect with the bit lines of the first group of bit lines 402-1. For example, the controller 104 may identify a first sub-memory block 404-1 that includes memory cells that correspond to the intersection of the word line 306-1 of the memory block 302-1 with the bit lines of the first group of bit lines 402-1. The controller 104 may the identify a second sub-memory block 404-2 that includes memory cells that correspond to the intersection of the word line 306-2 of the memory block 302-2 with the bit lines of the first group of bit lines 402-1. The controller 104 may continue to identify other sub-memory blocks that includes memory cells that correspond to the intersection of the word line of the memory blocks 302-1-302-N with the bit lines of the first group of bit lines 402-1. Additionally, or alternatively, the controller 104 may continue to identify all sub-memory blocks 404-1 to 404-N corresponding to word lines 306-1 to 306-N that intersect with each of the plurality of groups of bit lines 402-1 to 402-N In some embodiments, the storage system 102 may include dummy bit lines 408 between each of the plurality of groups of bit lines 402-1 to 402-N. The dummy bit lines may be configured to mitigate electric field leakage of the voltage of each respective group of bit lines 402-1 to 402-N. For example, bit line to bit line break down and erase disturb in adjacent big lines having common word lines may result in electrons leaking from one bit line to another. The dummy bit lines 408 absorb the leaking electrons, which may maintain a voltage of the bit lines 304-1 to 304-N.

The controller 104 is configured to logically group the memory cells of the memory block 302-1 that correspond the sub-memory blocks 404-1 to 404-N. For example, the controller 104 may store memory addresses of the memory cells corresponding to the sub-memory block 404-1 in a logical address table. The logical address table may include an address map of physical memory addresses of memory cells that correspond to logical memory blocks, such as the sub-memory blocks 404-1 to 404-N. The controller 104 may continue to store memory address of memory cells corresponding to other identified sub-memory blocks, such as sub-memory blocks 404-2 to 404-N, in the logical address table.

As described, the controller 104 is configured to perform various operations on logical memory blocks of the storage system 102. For example, the controller 104 may perform an erase operation memory blocks of the storage system 102. During performance of the erase operation, the controller 104 may identify the one or more sub-memory blocks 404-1 to 404-N using the logical address table. The controller 104 may then perform the erase operation on the one or more identified sub-memory blocks 404-1 to 404-2.

In some embodiments, the controller 104 may be configured to use a pseudo random access mode to perform a partial page program with by identifying one or more sub-memory blocks 404-1 to 404-N using the logical address table. In some embodiments, the controller 104 may be configured to perform a drain side gate induced drain leak (GIDL) erase operation on one or more of the sub-memory blocks 404-1 to 404-N.

In some embodiments, the controller 104 may perform the methods described herein. However, the methods described herein as performed by the controller 104 are not meant to be limiting, and any type of software executed on a controller can perform the methods described herein without departing from the scope of this disclosure. For example, a controller such as a processor executing software within the host 106 or firmware within the storage system 102 (e.g., stored on ROM 232 or NVM memory block 110) can perform the methods described herein.

Figure 5:
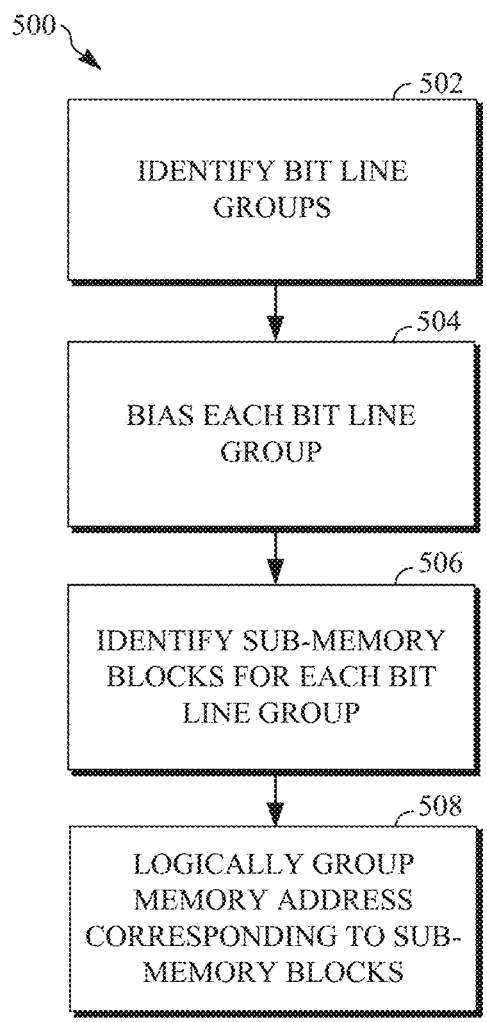
FIG. 5 is a flow diagram illustrating a sub-memory block definition method according to the principles of the present disclosure.

FIG. 5 is a flow diagram illustrating a sub-memory block definition method 500 according to the principles of the present disclosure. At 502, the method 500 identifies bit line groups. For example, the controller 104 may identify the plurality of groups of bit lines 402-1 to 402-N. At 504, the method 500 biases each bit line group. For example, the controller 104 may selectively control bit line transistors corresponding to respective bit lines of each respective group of bit lines 402-1 to 402-N. The controller 104 may bias the respective bit lines to respective voltages using the bit line transistors. For example, the controller 104 may bias bit lines of the group of bit lines 402-1 to the first voltage using bit line transistors corresponding to the respective bit lines of the group of bit lines 402-1. At 506, the method 500 identifies sub-memory blocks for each bit line group. For example, the controller 104 may identify sub-memory blocks 404-1 to 404-N by identifying word lines 306-1 to 306-N that intersect with respective ones of the groups of bit lines 402-1 to 402-N. At 508, the method 500 logically groups memory addresses corresponding to the sub-memory blocks. For example, the controller 104 logically groups memory cells corresponding to respective ones of the sub-memory blocks 404-1 to 404-N. The controller 104 may store memory addresses of the memory cells corresponding to the respective ones of the sub-memory blocks 404-1 to 404-N in a logical address table in order to make the physical address of the memory cells to the respective logical addresses of the sub-memory blocks 404-1 to 404-N.

In some embodiments, a method for memory block management includes identifying a first group of bit lines corresponding to memory blocks of a 3-dimensional memory array. The method also includes biasing the first group of bit lines to a first voltage using respective bit line biasing transistors. The method also includes identifying, for each memory block, respective sub-memory blocks corresponding to word lines of each memory block that intersect the first group of bit lines. The method also includes logically grouping memory addresses of memory cells for each respective sub-memory block associated with the first group of bit lines.

In some embodiments, the method also includes performing an operation on at least one sub-memory block. In some embodiments, the operation includes an erase operation. In some embodiments, the memory array includes a complementary metal-oxide semiconductor under the array memory structure (CUA). In some embodiments, the memory array includes a complementary metal-oxide semiconductor adjacent to the array memory structure (CAA). In some embodiments, each respective sub-memory block includes an 8-kilobyte sub-memory block. In some embodiments, each respective sub-memory block includes a 4-kilobyte sub-memory block. In some embodiments, the method also includes identifying a second group of bit lines corresponding to the memory blocks and biasing the second group of bit lines to a second voltage, different from the first voltage, using respective bit line biasing transistors. In some embodiments, the method also includes identifying, for each memory block, respective sub-memory blocks corresponding to word lines of each memory block that intersect the second group of bit lines and logically grouping memory addresses of memory cells for each respective sub-memory block associated with the second group of bit lines.

In some embodiments, a controller includes a bus interface and a processor. The bus interface is in communication with a plurality of memory blocks of a 3-dimensional memory array. The processor is configured to: identify a first group of bit lines corresponding to the memory blocks; bias the first group of bit lines to a first voltage using respective bit line biasing transistors: identify, for each memory block, respective sub-memory blocks corresponding to word lines of each memory block that intersect the first group of bit lines; and logically group memory addresses of memory cells for each respective sub-memory block associated with the first group of bit lines.

In some embodiments, the processor is further configured to perform an operation on at least one sub-memory block. In some embodiments, the operation includes an erase operation. In some embodiments, the memory array includes a complementary metal-oxide semiconductor under the array memory structure (CUA). In some embodiment, the memory array includes a complementary metal-oxide semiconductor adjacent to the array memory structure (CAA). In some embodiments, each respective sub-memory block includes an 8-kilobyte sub-memory block. In some embodiments, each respective sub-memory block includes a 4-kilobyte sub-memory block. In some embodiments, the processor is further configured to: identify a second group of bit lines corresponding to the memory blocks; and bias the second group of bit lines to a second voltage, different from the first voltage, using respective bit line biasing transistors. In some embodiments, the processor is further configured to: identify, for each memory block, respective sub-memory blocks corresponding to word lines of each memory block that intersect the second group of bit lines; and logically group memory addresses of memory cells for each respective sub-memory block associated with the second group of bit lines.

In some embodiments, a method for defining sub-memory blocks in a memory system includes identifying a plurality of bit line groups corresponding to memory blocks of a 3-dimensional memory array. The method also includes biasing each bit line group of the plurality of bit line groups to a respective voltage using bit line biasing transistors corresponding to each respective bit line group of the plurality of bit line groups. The method also includes identifying, for each memory block, respective sub-memory blocks corresponding to word lines of each memory block that intersect with respective ones of the bit line groups of the plurality of bit line groups. The method also includes logically grouping memory addresses of memory cells for each respective sub-memory block.

In some embodiments, the method also includes performing an erase operation on selected ones of the sub-memory blocks.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications. In the preceding description and in the claims, the terms "including" and "comprising" are used in an open-ended fashion, and thus should be interpreted to mean "including, but not limited to . . . ." In addition, the term "couple" or "couples" is intended to mean either an indirect or a direct connection. Thus, if a first device couples to a second device, that connection may be through a direct connection or through an indirect connection via other devices and connections.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same embodiment or implementation unless described as such.

Implementations the systems, algorithms, methods, instructions, etc., described herein can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably.

As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combination thereof. In other embodiments, a module can include memory that stores instructions executable by a controller to implement a feature of the module. In some embodiments, the controller 104 is implemented within the host 106 can be configured with hardware and/or firmware to perform the various functions described herein.

"Controller" shall mean individual circuit components, an application-specific integrated circuit (ASIC), a microcontroller with controlling software, a digital signal processor (DSP), a processor with controlling software, a field programmable gate array (FPGA), or combinations thereof.

Further, in one aspect, for example, systems described herein can be implemented using a general-purpose computer or general-purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

Further, all or a portion of implementations of the present disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments, implementations, and aspects have been described in order to allow easy understanding of the present invention and do not limit the present invention. On the contrary, the invention is intended to cover various modifications and equivalent arrangements included within the scope of the appended claims, which scope is to be accorded the broadest interpretation to encompass all such modifications and equivalent structure as is permitted under the law.

What is claimed is:

1. A method for memory block management, the method comprising:
   identifying a first group of bit lines corresponding to memory blocks of a 3-dimensional memory array;
   identifying a second group of bit lines corresponding to the memory blocks;
   biasing the first group of bit lines to a first voltage using respective bit line biasing transistors;
   biasing the second group of bit lines to a second voltage using respective bit line biasing transistors;
   identifying, for each memory block, respective sub-memory blocks corresponding to word lines of each memory block that intersect the first group of bit lines;
   logically grouping memory addresses of memory cells for each respective sub-memory block associated with the first group of bit lines;
   identifying, for each memory block, respective sub-memory blocks corresponding to word lines of each memory block that intersect the second group of bit lines; and
   logically grouping memory addresses of memory cells for each respective sub-memory block associated with the second group of bit lines.

2. The method of claim 1, further comprising performing an operation on at least one sub-memory block.

3. The method of claim 2, wherein the operation includes an erase operation.

4. The method of claim 1, wherein the memory array includes a complementary metal-oxide semiconductor under the array memory structure (CUA).

5. The method of claim 1, wherein the memory array includes a complementary metal-oxide semiconductor adjacent to the array memory structure (CAA).

6. The method of claim 1, wherein each respective sub-memory block includes an 8-kilobyte sub-memory block.

7. The method of claim 1, wherein each respective sub-memory block includes a 4-kilobyte sub-memory block.

8. The method of claim 1, further comprising:
   identifying, for each memory block, respective sub-memory blocks corresponding to word lines of each memory block that intersect the second group of bit lines; and
   logically grouping memory addresses of memory cells for each respective sub-memory block associated with the second group of bit lines.

9. A controller comprising:
   a bus interface in communication with a plurality of memory blocks of a 3-dimensional memory array that includes a complementary metal-oxide semiconductor under an array memory structure (CUA) or adjacent to the array memory structure (CAA); and
   a processor configured to:
      identify a first group of bit lines corresponding to the memory blocks;
      bias the first group of bit lines to a first voltage using respective bit line biasing transistors;

identify, for each memory block, respective sub-memory blocks corresponding to word lines of each memory block that intersect the first group of bit lines; and logically group memory addresses of memory cells for each respective sub-memory block associated with the first group of bit lines.

10. The controller of claim 9, wherein the processor is further configured to perform an operation on at least one sub-memory block.

11. The controller of claim 10, wherein the operation includes an erase operation.

12. The controller of claim 9, wherein the complementary metal-oxide semiconductor is under the array memory structure (CUA).

13. The controller of claim 9, wherein the complementary metal-oxide semiconductor is adjacent to the array memory structure (CAA).

14. The controller of claim 9, wherein each respective sub-memory block includes an 8-kilobyte sub-memory block.

15. The controller of claim 9, wherein each respective sub-memory block includes a 4-kilobyte sub-memory block.

16. The controller of claim 9, wherein the processor is further configured to:

identify a second group of bit lines corresponding to the memory blocks; and bias the second group of bit lines to a second voltage, different from the first voltage, using respective bit line biasing transistors.

17. The controller of claim 16, wherein the processor is further configured to:

identify, for each memory block, respective sub-memory blocks corresponding to word lines of each memory block that intersect the second group of bit lines; and logically group memory addresses of memory cells for each respective sub-memory block associated with the second group of bit lines.

18. A method for defining sub-memory blocks in a memory system, the method comprising:

identifying a first bit line group corresponding to memory blocks of a 3-dimensional memory array;

biasing the first bit line group to a first voltage using respective bit line biasing transistors;

identifying a second bit line group corresponding to the memory blocks;

biasing the second bit line group using a second voltage that is different than the first voltage using respective bit line transistors;

identifying, for each memory block, respective first and second sub-memory blocks corresponding to word lines of each memory block that intersect with respective ones of the first and second bit line groups; and logically grouping memory addresses of memory cells for each respective sub-memory block.

19. The method of claim 18, further comprising performing an erase operation on selected ones of the sub-memory blocks.

* * * * *